United States Patent
Choi et al.

(10) Patent No.: US 10,490,427 B2
(45) Date of Patent: Nov. 26, 2019

(54) APPARATUS FOR TREATING SUBSTRATE

(71) Applicant: Semes Co., Ltd., Cheonan-si, Chungcheongnam-do (KR)

(72) Inventors: Jung Bong Choi, Cheonan-si (KR); Seong Soo Kim, Cheonan-si (KR); Chan-Young Heo, Cheonan-si (KR); Oh Jin Kwon, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 556 days.

(21) Appl. No.: 14/747,704

(22) Filed: Jun. 23, 2015

(65) Prior Publication Data
US 2016/0013079 A1   Jan. 14, 2016

(30) Foreign Application Priority Data
Jul. 11, 2014   (KR) .................... 10-2014-0087756

(51) Int. Cl.
*H01L 21/67* (2006.01)

(52) U.S. Cl.
CPC .... *H01L 21/6708* (2013.01); *H01L 21/67051* (2013.01); *H01L 21/67115* (2013.01); *H01L 21/67248* (2013.01)

(58) Field of Classification Search
CPC . H01L 21/67115; C23C 16/481; C30B 25/10; C30B 25/105; F27B 17/0025; H05B 3/0047
See application file for complete search history.

(56) References Cited

U.S. PATENT DOCUMENTS

| | | | | |
|---|---|---|---|---|
| 5,792,273 | A * | 8/1998 | Ries | C30B 25/105 118/725 |
| 7,837,803 | B2 * | 11/2010 | Hohenwarter | H01L 21/67051 134/21 |
| 9,748,118 | B2 * | 8/2017 | Kim | H01L 21/67051 |
| 2002/0185062 | A1 * | 12/2002 | Halpin | C23C 16/4584 118/50.1 |

(Continued)

FOREIGN PATENT DOCUMENTS

| | | |
|---|---|---|
| JP | 2014093449 A | 5/2014 |
| KR | 20070114441 A | 12/2007 |

(Continued)

OTHER PUBLICATIONS

Machine Translation of KR 1020070114441 of Lee et al. originally published Dec. 4, 2007 (Year: 2007).*

(Continued)

*Primary Examiner* — Karla A Moore
*Assistant Examiner* — Margaret D Klunk
(74) *Attorney, Agent, or Firm* — Carter, DeLuca & Farrell LLP

(57) ABSTRACT

A substrate treating apparatus is provided which includes a treating container of which a top end is opened, a substrate support unit placed in a treating container to support a substrate, a treatment solution supply unit supplying a treatment solution to a substrate put on the support unit, and a heating unit placed in the substrate support unit to heat the substrate. The heating unit includes a heating element and a reflection element reflecting a heat from the heating element upward.

9 Claims, 5 Drawing Sheets

(56) References Cited

U.S. PATENT DOCUMENTS

| | | | | |
|---|---|---|---|---|
| 2010/0111511 A1* | 5/2010 | Merry | ............... | C23C 16/481 |
| | | | | 392/411 |
| 2013/0061873 A1* | 3/2013 | Hohenwarter | .... | H01L 21/02057 |
| | | | | 134/1.3 |
| 2013/0284095 A1* | 10/2013 | Ranish | .............. | H01L 21/02104 |
| | | | | 118/725 |

FOREIGN PATENT DOCUMENTS

| KR | 20090045984 A | 5/2009 |
|---|---|---|
| KR | 20100028752 A | 3/2010 |
| KR | 20120059413 A | 6/2012 |
| KR | 101324211 B1 | 11/2013 |
| KR | 101350781 B1 | 1/2014 |
| KR | 20140047564 A | 4/2014 |
| KR | 20140063679 A | 5/2014 |
| KR | 101458001 B1 | 11/2014 |

OTHER PUBLICATIONS

Chinese Office Action received Feb. 26, 2018 and issued in Chinese Patent Application No. 201510409339 together with English translation.

* cited by examiner

APPARATUS FOR TREATING SUBSTRATE

CROSS-REFERENCE TO RELATED APPLICATIONS

A claim for priority under 35 U.S.C. § 119 is made to Korean Patent Application No. 10-2014-0087756 filed Jul. 11, 2014, in the Korean Intellectual Property Office, the entire contents of which are hereby incorporated by reference.

BACKGROUND

Embodiments of the inventive concepts described herein relate to a substrate treating apparatus, and more particularly, relates to a substrate treating apparatus for performing a process while heating a substrate.

In general, a variety of processes such as a photoresist coating process, a developing process, an etching process, and an ashing process may be performed to treat a glass substrate or a wafer in manufacturing a flat panel display or a semiconductor device.

In each process, a wet cleaning process may be performed to remove a variety of contaminants attached to the substrate, and a drying process may be performed to dry a chemical solution remaining on a surface of the substrate or pure water (e.g., deionized water).

Recently, an etching process may be used to selectively remove a silicon nitride film and a silicon oxide film using the chemical solution, which is used at high temperature, such as sulfuric acid or phosphoric acid.

In the substrate treating apparatus using a high-temperature chemical solution, the substrate heating apparatus may be utilized to improve an etch rate.

SUMMARY

Embodiments of the inventive concepts provide a substrate treating apparatus capable of uniformly heating a substrate in treating a substrate. An embodiment of the inventive concept provides a substrate treating apparatus.

One aspect of embodiments of the inventive concept is directed to provide a substrate treating apparatus including a treating container of which a top end is opened, a substrate support unit placed in a treating container to support a substrate, a treatment solution supply unit supplying a treatment solution to a substrate put on the support unit, and a heating unit placed in the substrate support unit to heat the substrate, the heating unit may include a heating element, and a reflection element reflecting a heat from the heating element upward.

The heating element may include in a plurality of lamps

The substrate support unit may include a chuck stage on which a substrate is put and rotatable, and a rotary unit having a hollow form and rotating the chuck stage in connection with the chuck stage, the heating element is located in the chuck stage and includes lamps concentrically arranged to have ring shapes of which distances from the center of the chuck stage are different from each other.

The reflection element may include a main reflection plate disposed between adjacent lamps.

The reflection element may further include an inner reflection plate located between the chuck stage and the lamps.

The reflection element may further include an outer reflection plate spaced apart from the inner reflection plate, with the lamps interposed therebetween.

A height of the outer reflection plate is lower than those of the main reflection plate and the inner reflection plate.

The reflection element may further include a lower reflection plate located under the lamps.

The main reflection plate protrudes upward from the lower reflection plate.

The main reflection plate may include a first side wall. The first side wall is inclined to be away from the adjacent lamps toward a top end thereof.

The main reflection plate may further include a second side wall, and the first side wall and the second side wall is symmetrical with a virtual line, passing through a center of the main reflection plate, as the center.

A width of the main reflection plate becomes progressively narrower toward a top end thereof.

The inner reflection plate is perpendicular to the lower reflection plate.

A surface of the reflection element is formed of a metallic material.

A surface of the reflection element is formed of one of gold, silver, or aluminum.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
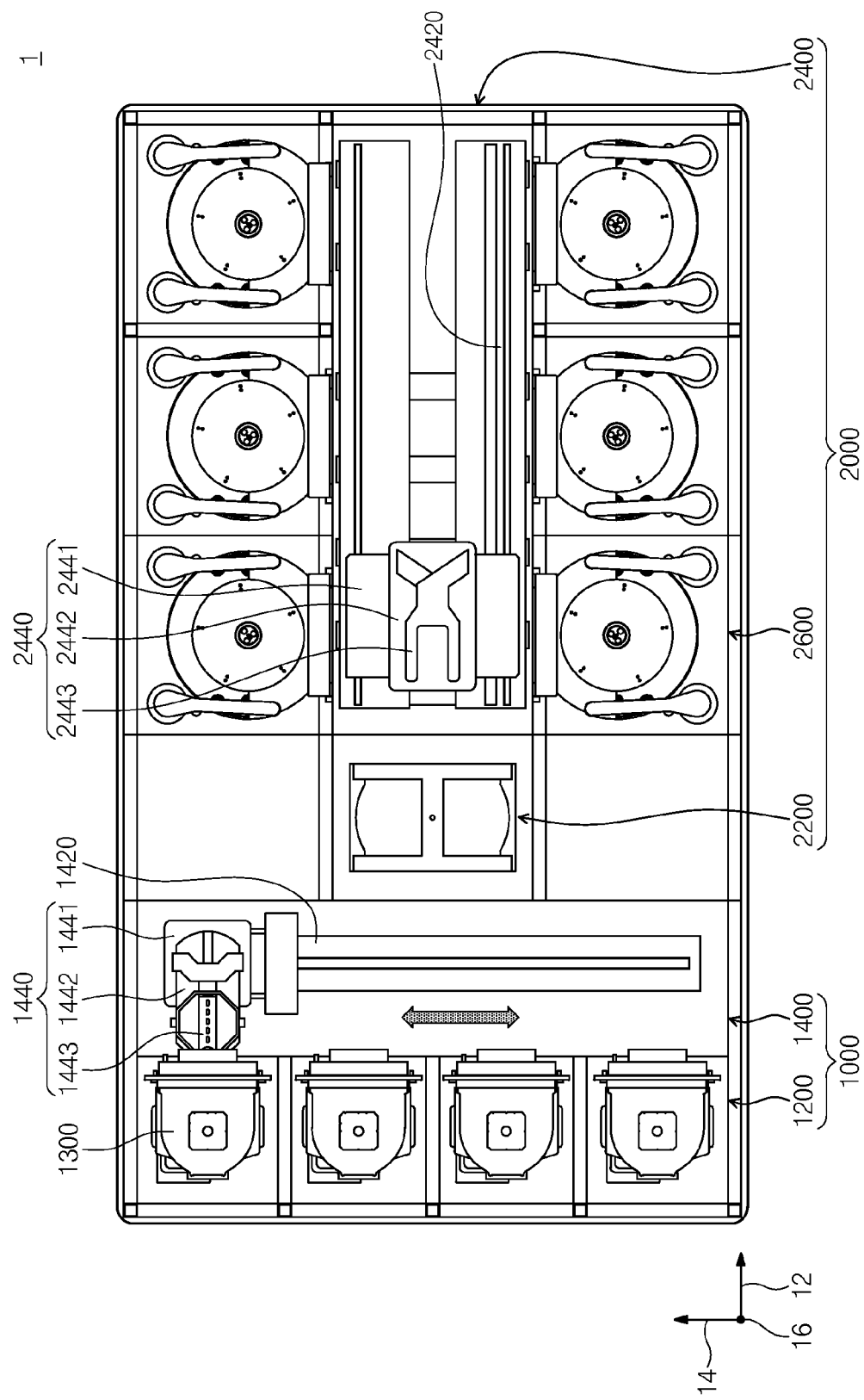
FIG. 1 is a plain view illustrating substrate treating equipment provided with a substrate treating apparatus according to an embodiment of the inventive concept.

Embodiments will be described in detail with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the concept of the inventive concept to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

In the description below, it will be understood that when an element such as a layer, region, substrate, plate, or member is referred to as being "on" another element, it can be directly on the other element or intervening elements may be present. In contrast, the term "directly" means that there are no intervening elements.

FIG. 1 is a plain view illustrating substrate treating equipment 1 of the inventive concept.

Referring to FIG. 1, substrate treating equipment 1 may include an index module 1000 and a process treating module 2000. The index module 1000 may include a load port 1200 and a transfer frame 1400. The load port 1200, the transfer frame 1400 and the process treating module 2000 may be arranged in a line, sequentially. Below, a direction in which the load port 1200, the transfer frame 1400 and the process treating module 2000 are arranged may be referred to a first direction 12. Accordingly, when viewed from the above, a direction perpendicular to the first direction 12 may be referred to as a second direction 14, and a direction perpendicular to a plane including the first direction 12 and the second direction 14 may be referred to as a third direction 16.

A carrier 1300 receiving a substrate W may be put in the load port 1200. The load port 1200 may include a plurality of load ports 1200, and the load ports 1200 may be disposed in a line along the second direction 14. In FIG. 1, an embodiment of the inventive concept is exemplified as four load ports 1200 are provided. However, the number of load ports 1200 may be increased or decreased according to a condition such as process efficiency and footprint. In the carrier 1300, a slot (not illustrated) may be formed to support an edge of the substrate W. The slot may be provided in plurality to the third direction 16. Substrates W may be located within the carrier 1300 so as to be stacked along the third direction, with the substrates W spaced apart from each other. A front opening unified pod (FOUP) may be used as the carrier 1300.

The process treating module 2000 may include a buffer unit 2200, a transfer chamber 2400 and a process chamber 2600. The transfer chamber 2400 may be disposed such that its length direction is parallel with the first direction 12. The process chambers 2600 may be disposed along the second direction 14 at one side and the other side of the transfer chamber 2400, respectively. The process chambers 2600 located at one side of the transfer chamber 2400 and the process chambers 2600 located at the other side of the transfer chamber 2400 may be provided to be symmetrical with each other with the transfer chamber 2400 as the center. Some of the process chambers may be disposed along a length direction of the transfer chamber 2400. Furthermore, some of the process chambers 2600 may be disposed to be stacked on each other. That is, the process chambers 2600 may be disposed at the one side of the transfer chamber 2400 in an A-by-B matrix (A and B being a natural number of 1 or more, respectively). Here, "A" may be the number of process chambers 2600 provided in a line along the first direction 12, and "B" may be the number of process chambers 2600 provided in a line along the third direction 16. When four or six process chambers 2600 are provided at the one side of the transfer chamber 2400, the process chambers 2600 may be disposed in a 2-by-2 or 3-by-2 matrix. The number of process chambers 2600 may be increased or decreased. Unlike as described above, the process chamber 2600 may be only provided at one side of the transfer chamber 2400. Moreover, unlike the above description, the process chambers 2600 may be provided in a single layer at one side and both sides of the transfer chamber 2400.

The buffer unit 2200 may be disposed between a transfer frame 1400 and the transfer chamber 2400. The buffer unit 2200 may provide a space in which the substrate W stays before transferred between the transfer chamber 2400 and the transfer frame 1400. The buffer unit 2200 may provide a slot (not illustrated) in which the substrate W is placed, and a plurality of slots (not illustrated) may be provided so as to be spaced apart from each other along the third direction. In the buffer unit 2200, a side facing the transfer frame 1400 and a side facing the transfer chamber 2400 may be opened.

The transfer frame 1400 may transfer the substrate W between a carrier 1300 and the buffer unit 2200 placed on the load port 1200. The transfer frame 1400 may include an index rail 1420 and an index robot 1440. The index rail 1420 may be provided such that its length direction is parallel with the second direction 14. The index robot 1440 may be installed on the index rail 1420 and may be moved linearly in the second direction 14 along the index rail 1420. The index robot 1440 may have a base 1441, a body 1442, and an index arm 1443. The base 1441 may be installed so as to be movable along the index rail 1420. The body 1442 may be joined with the base 1441. The body 1442 may be provided so as to be movable along the third direction 16 on the base 1441. Furthermore, the body 1442 may be provided to be rotatable on the base 1441. The index arm 1443 may be joined to the body 1442 and may be provided so as to be movable forward and backward with respect to the body 1442. The index arm 1443 may be provided in plurality, and the index arms 1443 may be driven independently of each other. The index arms 1443 may be stacked such that they are spaced apart from each other along the third direction 16. A portion of the index arms 1443 may be used to transfer the substrate W from the process treating module 2000 to the carrier 1300, and a portion of remaining index arms 1443 may be used to transfer the substrate W from the carrier 1300 to the process treating module 2000. Accordingly, it may be possible to prevent particles, generated from a substrate W prior to processing the substrate W when the substrate W is carried into or out by the index robot 1440, from being attached to the substrate W after processing the substrate W.

The transfer chamber 2400 may transfer the substrate W between the buffer unit 2200 and the process chamber 2600 and between the process chambers 2600. The transfer chamber 2400 may include a guide rail 2420 and a main robot 2440. The guide rail 2420 may be disposed such that its length direction is parallel with the first direction 12. The main robot 2440 may be installed on the guide rail 2420 and may be moved in a straight line along the first direction 12. The main robot 2440 may include a base 2441, a body 2442 and a main arm 2443. The base 2441 may be installed to be movable along the guide rail 2420. The body 2442 may be joined with the base 2441. The body 2442 may be provided to be movable along the third direction 16 on the base 2441. Furthermore, the body 2442 may be provided to be rotatable on the base 2441. The main arm 2443 may be joined to the body 2442 such that it is forward and backward movable with respect to the body 2442. The main arm 2443 may be provided in plurality, and the plurality of arms 2443 may be driven independently of each other. The main arms 2443 may be stacked such that they are spaced apart from each other along the third direction 16. The main arm 2443 used to transfer the substrate W from the buffer unit 2200 to the process chamber 2600 may be different from the main arm 2443 used to transfer the substrate W from the process chamber 2600 to the buffer unit 2200.

The substrate treating apparatus 10 may be provided in the process chamber 2600 to perform a cleaning process on the substrate W. A structure of the substrate treating apparatus 10 in each process chamber 2600 may be variable according to a type of a cleaning process. Selectively, the substrate treating apparatuses 10 in the process chambers 2600 may have the same structure. Optionally, the process chambers 2600 may be separated into a plurality of groups. In this case, the substrate treating apparatuses 10 of process chambers belonging to the same group may have the same structure; on the other hand, the substrate treating apparatuses 10 of process chambers 2600 belonging to different groups may have different structures. For example, when the process chambers 2600 are divided into two groups, the process chambers 2600 of the first group may be provided at one side of the transfer chamber 2400, and the process chambers 2600 of the second group may be provided at the other side of the transfer chamber 2400. Selectively, at each of one side and other side of the transfer chamber 2400, the process chambers 2600 of the first group may be provided in a lower layer, and the process chambers 2600 of the second group may be provided in an upper layer. The process chambers 2600 may be classified into the first group and the second group based on a type of used chemical or a type of used cleaning manner.

Below, an apparatus will be described which cleans a substrate W using treating fluid such as sulfuric acid of high temperature, alkali liquid, acid liquid, rinsing liquid and drying gas. However, the scope and spirit of the inventive concept may not be limited thereto. The inventive concept may be applied to various apparatuses that perform a process such as an etching process while rotating the substrate W.

Figure 2:
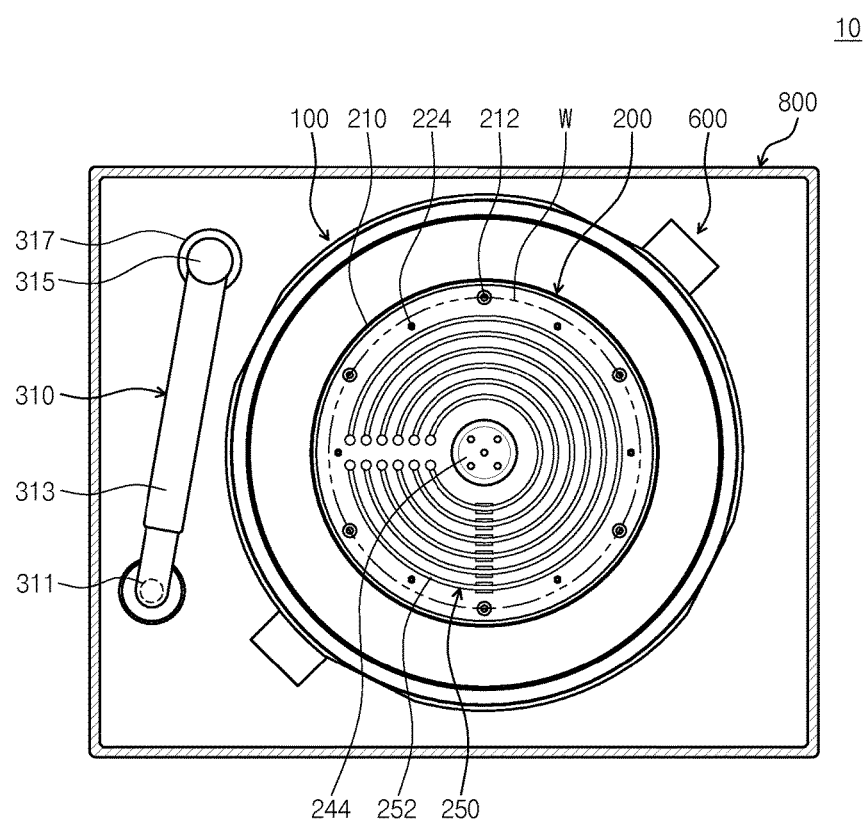
FIG. 2 is a plain view of a substrate treating apparatus of FIG. 1.
Figure 3:
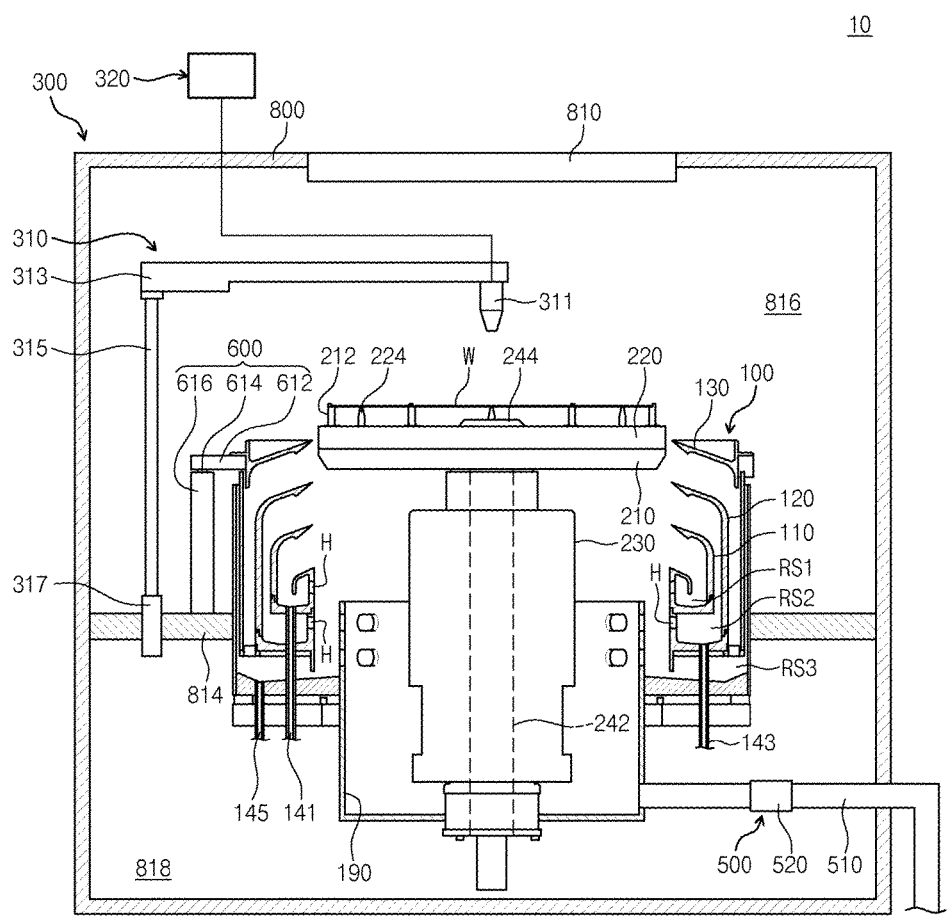
FIG. 3 is a cross-sectional view of the substrate treating apparatus in FIG. 1.

FIG. 2 is a plain view of a substrate treating apparatus of FIG. 1, and FIG. 3 is a cross-sectional view of the substrate treating apparatus of FIG. 1. Referring to FIGS. 2 and 3, a substrate treating apparatus 10 may include a chamber 800, a treating container 100, a substrate support unit 200, a heating unit 280, a treatment solution supply unit 300, a process exhaust unit 500, and an elevation unit 600.

The camber 800 may supply a closed inner space. A gas flow supply unit 810 may be disposed at a top end portion of the chamber 800. The gas flow supply unit 810 may form a descending air current in the chamber 800.

The gas flow supply unit 810 may filter a high-humidity air to supply it into the chamber. As the high-humidity air is supplied to the chamber through the gas flow supply unit 810, a downdraft may be formed. The downdraft may allow a uniform air current to be supplied on the substrate W, and contaminants generated during treating a surface of the substrate W may be discharged to an outlet 500 through collection vessels 110, 120 and 130 of a treating container 100 together with air.

The chamber 800 may be divided into a process region 816 and a maintenance region 818 by a horizontal partition 814. The treating container 100 and a substrate support unit 200 may be located in the process region 816. Exhaust lines 141, 143 and 145 coupled to the treating container 100, a deflation line 510, a driver of an elevation unit 600, a driving unit connected to a treatment solution supply unit 300, and a supply line may be located in the maintenance region 818. The maintenance region 818 may be isolated from the process region 816.

The treating container 100 may have a cylindrical shape of which the top end is opened and may provide a process space for processing the substrate W. The opened top end of the treating container 100 may be used as a path for carrying in and out the substrate W. The substrate support unit 200 may be located in a process space. When a process is performed, the substrate support unit 200 may support the substrate W and may rotate the substrate W.

For forced exhaust, the treating container 100 may provide a lower space where an air exhaust duct 190 is connected to a bottom end portion. First to third collection vessels 110, 120 and 130 which collect a treatment solution and a gas scattered on a rotating substrate W may be disposed in multi-stage in the treating container 100.

The first to third collection vessels 110, 120 and 130 having a ring shape may have exhaust ports H connected with a common ring-shaped space.

Specifically, each of the first to third collection vessels 110, 120 and 130 may include a bottom surface having a ring shape and a sidewall extending from the bottom surface and having a cylindrical shape. The second collection vessel 120 may surround the first collection vessel 110 and may be spaced apart from the first collection vessel 110. The third collection vessel 130 may surround the second collection vessel 120 and may be spaced apart from the second collection vessel 120.

The first to third collection vessels 110, 120 and 130 may provide first to third collection space RS1, RS2 and RS3 which an air current containing a treatment solution and fume scattered from the substrate W flows in. The first collection space RS1 may be defined by the first collection vessel 110, the second collection space RS2 may be defined by a space between the first collection vessel 110 and the second collection vessel 120, and the third collection space RS3 may be defined by a space between the second collection vessel 120 and the third collection vessel 130.

Each of top surfaces of the first to third collection vessels 110, 120 and 130 may be opened at a center portion. Each of the first to third collection vessels 110, 120 and 130 may have an inclined surface, and the inclined surface may be formed in such a way that a distance between the inclined surface and a corresponding bottom surface becomes progressively greater toward the opening from the sidewall. The treatment solution scattered from the substrate W may flow in the first and third collection spaces RS1, RS2 and RS3 along top surfaces of the first to third collective vessels 110, 120 and 130.

The first treatment solution flowing in the first collection space RS1 may be discharged to the outside through the first collection line 141. The second treatment solution flowing in the second collection space RS2 may be discharged to the outside through the second collection line 143. The third treatment solution flowing in the third collection space RS3 may be discharged to the outside through the third collection line 145.

The treatment solution supply unit 300 may output high-temperature chemical for etching the substrate W. For example, the treatment solution may be a mixed solution of sulfuric acid, phosphoric acid, or sulfuric acid and phosphoric acid.

A treatment solution nozzle element 310 may include a nozzle 311, a nozzle arm 313, a support load 315, and a nozzle driver 317. The nozzle 311 may receive the treatment solution through a supply unit 320. The nozzle 311 may inject the treatment solution to a surface of the substrate W. A length of the nozzle arm 313 may extend in one direction, and the nozzle 311 may be mounted to a front end of the nozzle arm 313. The nozzle arm 313 may support the nozzle 311. The support rod 315 may be mounted to a rear end of the nozzle 313. The support rod 315 may be located on a bottom end of the nozzle arm 313. The support rod 315 may be disposed vertically to the nozzle arm 313. The nozzle driver 317 may be provided at a bottom end of the support rod 315. The nozzle driver 317 may rotate the support load 315 with a length-directional axis of the support rod 315 as the center. Rotation of the support load 315 may allow the nozzle arm 313 and the nozzle 311 to conduct swing movement using the support load 315 as an axis. The nozzle 311 may move to swing between the inside and the outside of the treating container 100. The nozzle 311 may output the treatment solution while moving to swing between a center region and an edge region of the substrate W.

A process exhaust unit 500 may be used to discharge air, gas, and the like in the treating container 100. According to one embodiment of the inventive concept, the process exhaust unit 500 may apply an exhaust pressure (a suction pressure) to a collection vessel, collecting the treatment solution, from among the first to third collection vessels 110, 120 and 130 during a process. The process exhaust unit 500 may include an exhaust line 510 connected to an exhaust duct 190, and a damper 520. The exhaust line 510 may be provided with the exhaust pressure from an exhaust pump (not illustrated) and may be coupled to a main exhaust line buried under a semiconductor production line.

On the other hand, the treating container 100 may be joined to an elevation unit 600 to change a vertical position of the treating container 100. The elevation unit 600 may linearly move the treating container 100 upward and downward. As the treating container 100 is moved upward and downward, a relative height of the treating container 100 to the substrate support unit 200 may be changed.

The elevation unit 600 may include a bracket 612, a moving shaft 614, and a driver 616. The bracket 612 may be fixed to an outer wall of the treating container 100. The moving shaft 614 may be fixedly connected the bracket 612 moving upward and downward by the driver 616. When the substrate W is loaded on or unloaded from the chuck stage 210, the treating container 100 may be lifted down such that the chuck stage 210 protrudes upward from a top surface of the treating container 100. Furthermore, when the process is in progress, a height of the treating container 100 may be adjusted such that the treatment solution flow in predetermined collection vessels 110, 120 and 130 depending on a type of the treatment solution supplied to the substrate W. A relative vertical position between the treating container 100 and the substrate W may be changed. In the treating container 100, treatment solutions and polluting gases respectively collected by the collection spaces RS1, RS2 and RS3 may be different from each other. According to an embodiment of the inventive concept, the elevation unit 600 may change the relative vertical position between the treating container 100 and the substrate support unit 200 by moving the treating container 100 vertically.

Figure 4:
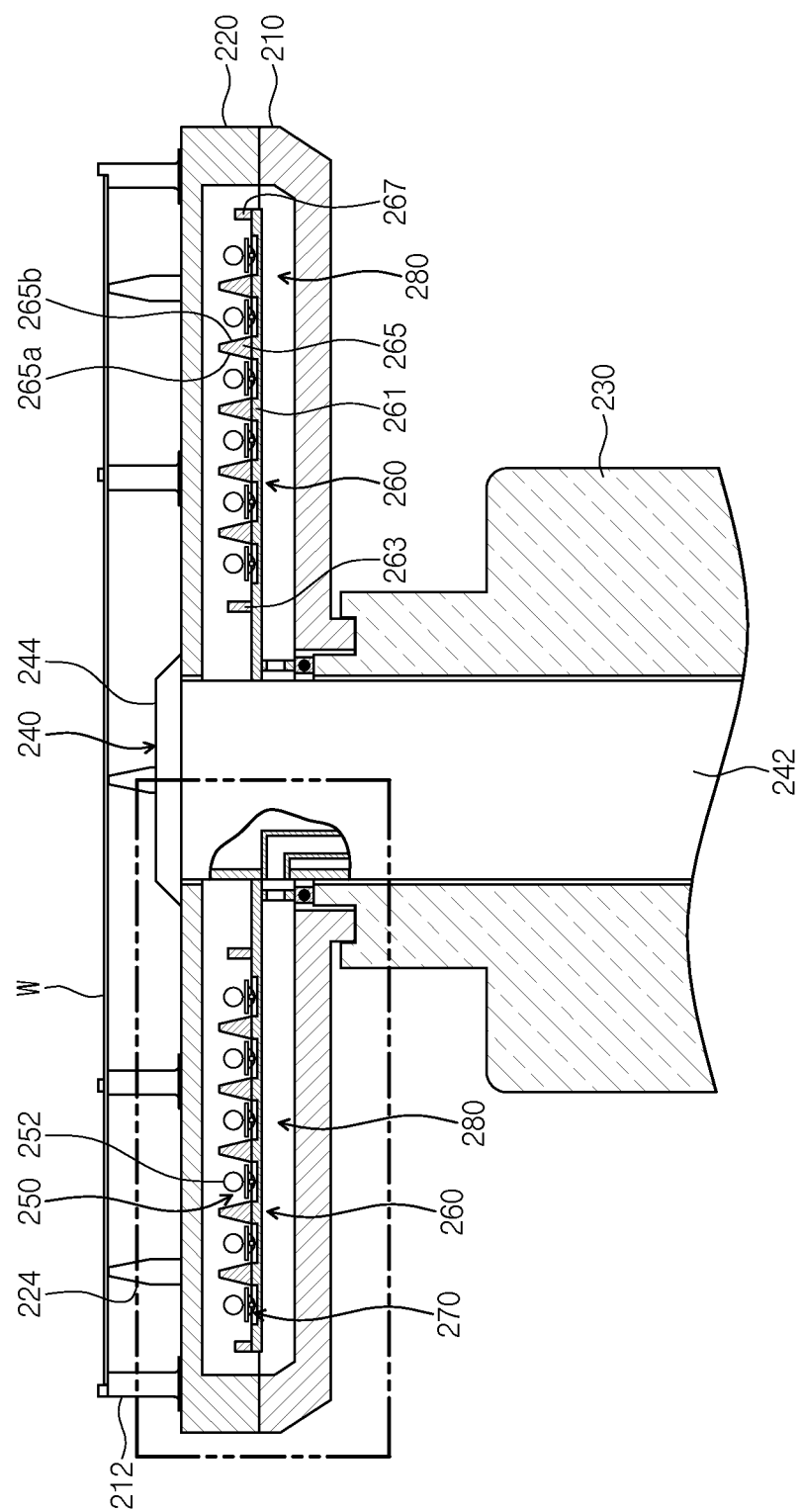
FIG. 4 is a cross-sectional view of a substrate supporting unit and a heating unit of FIG. 2, according to an exemplary embodiment of the inventive concept.
Figure 5:
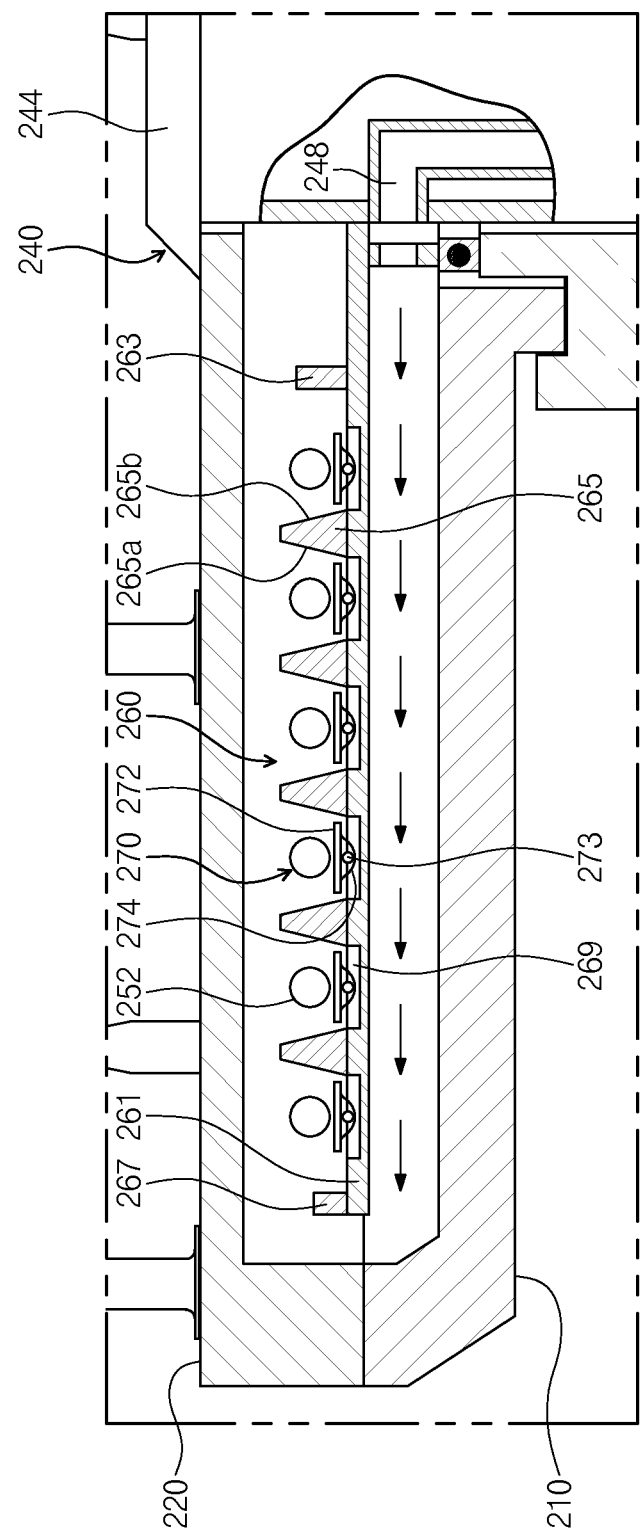
FIG. 5 is a partially enlarged view of the heating unit in FIG. 4.

FIG. 4 is a cross-sectional view of a substrate support unit and a heating unit of FIG. 2, according to an exemplary embodiment of the inventive concept. FIG. 5 is a partially enlarged view of a heating unit of FIG. 4. Referring to FIGS. 2 to 5, during the process, a substrate support unit 200 may support the substrate W and may be rotated by a driver 240.

The substrate support unit 200 may include a chuck stage 210, a quartz window 220, a rotary unit 230, and a back nozzle 240.

The chuck stage 210 may have a circular top surface. The chuck stage 210 may rotate in connection with the rotary unit 230. Chucking pins 212 may be installed at an edge of the chuck stage 210. The chucking pins 212 may pass through the quartz window 220 to protrude upward from a top surface of the quartz window 220. The chucking pins 212 may align the substrate W supported by a plurality of the support pins 224 so as to be put on a given position. During a process, the chucking pins 212 may be in contact with the sidewall of the substrate W and may prevent the substrate W from being separated from a given position.

The rotary unit 230 may have a hollow form and may be joined to the chuck stage 210 to rotate the chuck stage 210.

The quartz window 220 may be located on the substrate W and the chuck stage 210. The quartz window 220 may be provided to protect the heating element 250. The quartz window 220 may be transparent. The quartz window 220 may rotate together with the chuck stage 210. The quartz window 220 may include support pins 224. The support pins 224 may be disposed at the edge of the top surface in the quartz window 220 and may be spaced apart from each other. The support pins 224 may protrude upward from the quartz window 220. The support pins 224 may support a bottom surface of the substrate W to allow the substrate W to be upward spaced apart from the quartz window 220.

The back nozzle unit 240 may be provided to inject chemical solution to a rear surface of the substrate W. The back nozzle unit 240 may include a nozzle body 242 and a chemical solution injection unit 244. The chemical solution injection unit 244 may be located on center portions of the chuck stage 210 and the quartz window 220. The nozzle body 242 may be installed to pass through the rotary unit 230, and a chemical solution moving line, a gas supply line and a fuzzy gas supply line may be provided in the interior of the nozzle body 242. The chemical moving line may supply an etching solution for etching a rear surface of the substrate W to the chemical solution injection unit 244. The gas supply line may supply nitrogen gas for controlling an etching uniformity to the rear surface of the substrate W. The fuzzy gas supply line may supply nitrogen fuzzy gas to prevent the etching solution from being infiltrated between the quartz window 220 and the nozzle body 242.

A heating unit 280 may be installed in the substrate support unit 200. The heating unit 280 may heat a substrate W while a process is performed. The heating unit 280 may include a heating element 250, a reflection element 260 and a temperature control unit 270.

The heating element 250 may be installed on the chuck stage 210. A diameter of the heating element 250 may be variable. The heating element 250 may be provided in plurality. The heating element 250 may be provided in a ring shape. For example, the heating element 250 may be provided in a plurality of lamps 252 having a ring shape. The temperature control units 270 may be provided to correspond to the lamps 252 for an independent control.

The heating element 250 may be sub-divided into a plurality of concentric regions. The lamps 252 capable of individually heating the regions may be provided in the regions, respectively. The lamps 252 may be provided in ring shapes which have different radial distances from the center of the chuck stage 210. An embodiment of the inventive concept is exemplified as the number of lamps 252 is "6". However, the scope and spirit of the inventive concept may not be limited thereto. For example, the number of lamps may increase or decrease according to a desired temperature. To this end, the temperature control units 270 for independently checking temperatures of the lamps 252 may be installed on the reflection element 260. For example, in a structure where the lamps 252 rotates together with the chuck stage 210, power may be supplied to the heating element 250 using a slip ring.

The reflection element 260 may be provided between the heating element 250 and the chuck stage 210. The reflection element 260 may reflect heat from the lamps 260 to a substrate W put thereon. The reflection element 260 may be supported by the nozzle body 242 installed to penetrate a center space of the rotary unit 230. The reflection element 260 may extend downward so as to be formed at an inside end. The reflection element 260 may not rotate together with the chuck stage 210, that is, may be fixed.

The reflection element 260 may include a lower reflection plate 261, an inner reflection plate 263, a main reflection plate 265 and an outer reflection plate 267. The lower reflection plate 261 may be located between a top portion of the chuck stage 210 and bottom surfaces of the lamps 252. The inner reflection plate 263 may be located to be adjacent to the center of a substrate support unit 200. The inner reflection plate 263 may be located between the lamps 252 and the nozzle body 242. The inner reflection plate 263 may protrude upward from the lower reflection plate 261. The inner reflection plate 263 may be provided in a ring shape. The inner reflection plate 263 may be vertically provided from the lower reflection plate 261. The main reflection plate 265 may protrude from the lower reflection plate 261 and may be provided in plurality. The main reflection plate 265 may be spaced apart from the inner reflection plate 263 in a direction away from a center of the chuck stage 210. The main reflection plate 265 may be provided in a ring shape. The main reflection plate 265 may be located between adjacent lamps 252. For example, the main reflection plate 265 may include a first side wall 265a and a second side wall 265b. The first side wall 265a may be inclined such that a distance between the first side wall 265a and adjacent lamps 252 increases toward a top end. The first side wall 265a and the second side wall 265b may be symmetrical with each other with a virtual line, passing through the center of the main reflection plate 265, as the center and may have the same angles of inclination. Alternatively, the main reflection plate 265 may be provided such that its section becomes progressively smaller toward a top end. A height of the main reflection plate 265 may be different from that of the inner reflection plate 261. The outer reflection plate 267 may be spaced apart from the inner reflection plate 267, with the lamps 252 interposed therebetween. The height of outer reflection plate 267 may be lower than those of the inner reflection plate 261 and the main reflection plate 265.

A surface of the reflection element 260 may be formed of a metallic material. The surface of the reflection element 260 may be formed of the metallic material having high heat reflectivity. For example, the surface of the reflection element 260 may be formed of a gold, silver or aluminum material. Alternatively, any other metallic material having high heat reflectivity as the metallic material.

The reflection element 260 may adjust a reflection direction of heat by providing the main reflection plates 265 between the heating elements 250, thereby making it possible to provide a lot of heat to the substrate W. Furthermore, a heat variation of the lower reflection plate 261 may be reduced by providing the main reflection plate 265.

Heat radiation pins (not illustrated) for heat radiation may be installed at the reflection element 260. To suppress heat generation of the reflection element 260, cooling gas may flow on a bottom surface of the lower reflection plate 261. For example, the nozzle body 242 may have an injection port 248 for injecting the cooling gas to the bottom surface of the lower reflection plate 261 toward a direction in which the temperature control units 270 are disposed.

The temperature control units 270 may be installed in line on a straight line of the reflection element 260 to measure a temperature of each of the IR lamps 252.

The temperature control unit 270 may include a support plate 272 and a temperature sensor device 273. The temperature control unit 270 with the above-described structure may be located to be adjacent to the heating element 250 to accurately measure a temperature of the heating element 250. It may be possible to measure and control a temperature by mounting a thin temperature control unit 270 at the reflection element 260

The support plat 272 may be formed in a slim shape and may extend toward one side of a fixed block. The support plate 272 may be disposed to be spaced apart toward a top surface of the lower reflection plate 261 and a penetration hole 269 may be formed on a surface of the lower reflection plate 261 facing the support plate 272. The cooling gas flowing on a bottom surface may cool the temperature control unit 270 through the penetration hole 269.

According to an exemplary embodiment of the inventive concept, a substrate treating apparatus may include a heat unit to heat a substrate uniformly during a process, thereby improving process efficiency.

According to an exemplary embodiment of the inventive concept, a substrate treating apparatus may include a reflection element to reflect heat of a heat unit, thereby making it possible to transmit a lot of heat onto a surface of a substrate.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating apparatus comprising:
   a treating container of which a top end is opened;
   a substrate support placed in a treating container to support a substrate;
   a treatment solution supply supplying a treatment solution to a substrate put on the substrate support; and
   a heating unit placed in the substrate support to heat the substrate,
   wherein the heating unit comprises:
      a heating element comprising a plurality of lamps; and
      a reflection element reflecting a heat from the heating element upward, the reflection element comprising:
         a lower reflection plate located under the lamps;
         a main reflection plate disposed between lamps on the lower reflection plate;
         an inner reflection plate located between a center of the substrate support and the lamps on the lower reflection plate; and
         an outer reflection plate spaced apart from the inner reflection plate, with the lamps interposed therebetween, and disposed on the lower reflection plate,
   wherein an uppermost surface of the outer reflection plate is horizontally lower than an uppermost surface of the main reflection plate and an uppermost surface of the inner reflection plate.

2. The substrate treating apparatus of claim 1, wherein the substrate support comprises:
   a chuck stage on which a substrate is put and rotatable; and
   a rotary unit having a hollow form and rotating the chuck stage in connection with the chuck stage,
   wherein the heating element is located in the chuck stage and includes the plurality of lamps concentrically arranged to have ring shapes of which distances from a center of the chuck stage are different from each other.

3. The substrate treating apparatus of claim 1, wherein the main reflection plate protrudes upward from the lower reflection plate.

4. The substrate treating apparatus of claim 3, wherein the main reflection plate comprises a first side wall, and
   wherein the first side wall is inclined to be away from adjacent lamps toward a top end thereof.

5. The substrate treating apparatus of claim 4, wherein the main reflection plate further comprises:
   a second side wall,
   wherein the first side wall and the second side wall is symmetrical with a virtual line, passing through a center of the main reflection plate, as the center.

6. The substrate treating apparatus of claim 1, wherein a width of the main reflection plate becomes progressively narrower toward a top end thereof.

7. The substrate treating apparatus of claim 6, wherein the inner reflection plate is perpendicular to the lower reflection plate.

8. The substrate treating apparatus of claim 1, wherein a surface of the reflection element is formed of a metallic material.

9. The substrate treating apparatus of claim 8, wherein a surface of the reflection element is formed of one of gold, silver, or aluminum.

* * * * *